US010103268B2

(12) United States Patent
Xiao

(10) Patent No.: US 10,103,268 B2
(45) Date of Patent: Oct. 16, 2018

(54) VERTICAL JUNCTIONLESS TRANSISTOR DEVICES

(71) Applicant: SEMICONDUCTOR MANUFACTURING INTERNATIONAL (SHANGHAI) CORPORATION, Shanghai (CN)

(72) Inventor: Deyuan Xiao, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/582,288

(22) Filed: Apr. 28, 2017

(65) Prior Publication Data

US 2017/0236945 A1 Aug. 17, 2017

Related U.S. Application Data

(62) Division of application No. 14/830,731, filed on Aug. 19, 2015, now Pat. No. 9,673,322.

(30) Foreign Application Priority Data

Aug. 26, 2014 (CN) .......................... 2014 1 0421827

(51) Int. Cl.
H01L 29/78 (2006.01)
H01L 29/786 (2006.01)
(Continued)

(52) U.S. Cl.
CPC .. *H01L 29/78609* (2013.01); *H01L 29/42392* (2013.01); *H01L 29/66522* (2013.01);
(Continued)

(58) Field of Classification Search
CPC ........... H01L 29/66666; H01L 29/7827; H01L 29/78642; H01L 29/0676; H01L 27/11582; H01L 29/66795
See application file for complete search history.

(56) References Cited

U.S. PATENT DOCUMENTS 9,209,247 B2 * 12/2015 Colinge ............ H01L 29/42376
9,331,124 B2 * 5/2016 Park .................... H01L 27/2454
(Continued)

FOREIGN PATENT DOCUMENTS

| CN | 102308388 | 1/2012 |
| CN | 103515430 | 1/2014 |
| CN | 105448989 | 3/2016 |

OTHER PUBLICATIONS

U.S. Appl. No. 14/830,731, Non-Final Office Action dated Nov. 10, 2016, 7 pages.
(Continued)

Primary Examiner — Joseph C Nicely
Assistant Examiner — David Goodwin
(74) Attorney, Agent, or Firm — Kilpatrick Townsend & Stockton LLP

(57) ABSTRACT

A semiconductor device includes a silicon substrate, a silicon germanium (SiGe) layer including a lower portion extending over the silicon substrate and a fin structure protruding above the lower portion, a first dielectric layer disposed over a side surface of the fin structure and a top surface of the lower portion of the silicon germanium (SiGe) layer, an indium gallium arsenide (InGaAs) layer disposed over a surface of the first dielectric layer, a high k oxide layer disposed over a surface of the InGaAs layer, and a metal layer disposed over a surface of the high k oxide layer. The InGaAs layer includes a source region, a channel region, and a drain region. The metal layer is configured to be a first gate
(Continued)

electrode, and the fin structure in the SiGe layer is configured to be a second gate electrode.

18 Claims, 17 Drawing Sheets

(51) Int. Cl.
 *H01L 29/423* (2006.01)
 *H01L 29/66* (2006.01)
(52) U.S. Cl.
 CPC .. *H01L 29/66666* (2013.01); *H01L 29/66742* (2013.01); *H01L 29/78642* (2013.01); *H01L 29/78645* (2013.01); *H01L 29/78681* (2013.01); *H01L 29/78696* (2013.01)

(56) References Cited

U.S. PATENT DOCUMENTS

| | | | |
|---|---|---|---|
| 2003/0124804 A1 | 7/2003 | Soo | |
| 2005/0142771 A1 | 6/2005 | Kim | |
| 2005/0184348 A1* | 8/2005 | Youn | H01L 21/823487 257/401 |
| 2006/0017104 A1* | 1/2006 | Yoon | H01L 29/66666 257/346 |
| 2007/0235794 A1* | 10/2007 | Yamazaki | H01L 29/42324 257/314 |
| 2010/0207201 A1* | 8/2010 | Masuoka | H01L 27/0207 257/329 |
| 2010/0219483 A1* | 9/2010 | Masuoka | H01L 21/845 257/369 |
| 2010/0230658 A1* | 9/2010 | Pillarisetty | H01L 29/161 257/14 |
| 2012/0119286 A1* | 5/2012 | Kim | H01L 27/10876 257/329 |
| 2012/0214285 A1* | 8/2012 | Guha | H01L 29/66666 438/270 |
| 2014/0008714 A1* | 1/2014 | Makala | H01L 21/28273 257/324 |
| 2014/0045311 A1* | 2/2014 | Doo | H01L 29/66833 438/269 |
| 2014/0166981 A1* | 6/2014 | Doyle | H01L 29/66666 257/24 |
| 2014/0170998 A1* | 6/2014 | Then | H01L 29/802 455/127.2 |
| 2015/0060998 A1 | 3/2015 | Mizushima | |
| 2015/0162438 A1* | 6/2015 | Chou | H01L 29/66825 257/321 |
| 2016/0064557 A1 | 3/2016 | Xiao | |

OTHER PUBLICATIONS

U.S. Appl. No. 14/830,731, Notice of Allowance dated Mar. 1, 2017, 9 pages.
U.S. Appl. No. 14/830,731, Restriction Requirement dated Mar. 23, 2016, 6 pages.
Chinese Application No. 201410421827.X, Office Action dated Feb. 9, 2018, 5 pages.

* cited by examiner ed on Aug. 19, 2015,

VERTICAL JUNCTIONLESS TRANSISTOR DEVICES

CROSS-REFERENCES TO RELATED APPLICATIONS

This application is a divisional application of U.S. patent application Ser. No. 14/830,731, filed on Aug. 19, 2015, which claims priority to Chinese patent application No. 201410421827.X, filed on Aug. 26, 2014, the contents of which are incorporated herein by reference in their entirety.

BACKGROUND OF THE INVENTION

The present invention relates to the field of semiconductor technology. Specifically, embodiments of the invention are directed to transistor device structure and its manufacturing methods.

As semiconductor memory devices become increasingly integrated, the feature size including the channel length of individual devices is gradually reduced. This causes a short channel effect and also increases the junction leakage current. Leakage current was not a significant problem in the past, but it has become a more serious concern now that transistor gates and other chip components measure only a few atoms thick. In a notebook computer, leakage current means short battery life and in a server computer, it means higher power bills. Also, in a nonvolatile memory device, the leakage current leads to degradation of data retention time and other electrical characteristics as the device feature size is reduced.

Further, in small geometry devices, the threshold voltage is often difficult to control, and junction leakage current also becomes more difficult to manage. Therefore, there is a need for an improved transistor device structure.

BRIEF SUMMARY OF THE INVENTION

In some embodiments of the present invention, transistor device structure and manufacturing methods are provided for integrating higher performance materials with silicon, such as III-V transistor channels that can provide higher carrier velocity and higher drive current. These hybrid semiconductors can be used to enable continued scaling beyond the capabilities of silicon alone. A challenge in integrating hybrid materials is caused by the atomic lattice mismatch between the materials. Embodiments of the invention provide methods for overcoming these issues. Further, a three-dimensional vertical transistor structure is provided that is junctionless and has a back gate for threshold voltage tuning.

According to some embodiments of the present invention, a method for forming a semiconductor device includes providing a substrate and forming fin device structure in a buffer layer. The fin device structure includes a lower portion extending over the silicon substrate and a fin structure protruding above the lower portion. The method also includes forming a sacrificial layer disposed over a side surface of the fin structure and a top surface of the lower portion of the buffer, and forming a device semiconductor layer disposed over a surface of the sacrificial layer. A gate dielectric layer is then formed and is disposed over a surface of the device semiconductor layer. A gate electrode layer is formed and disposed over a surface of the gate dielectric layer. The method includes removing a portion of the sacrificial layer to form a cavity surrounding the fin structure and performing an oxidation process to form a thermal oxide layer in the cavity surrounding the side surface of the fin structure.

In an embodiment of the above method, the sacrificial layer is configured to be a seed layer for the formation of the device semiconductor layer using an epitaxial process. In an embodiment, the substrate includes a silicon substrate. In an embodiment, the gate dielectric layer includes a high k oxide layer, and the gate electrode layer includes a metal layer. In some embodiments, the buffer layer comprises a silicon germanium (SiGe) layer, the sacrificial layer comprises an aluminum arsenide (AlAs) layer, and the device semiconductor layer comprises one or more of indium gallium arsenide (InGaAs), indium arsenide (InAs), indium antimonide (InSb), or germanium (Ge). In some embodiments, the method also includes, after forming the gate electrode layer, performing a planarization process to expose a top surface of the fin structure. In some embodiments, the method also includes removing a second portion of the sacrificial layer from a surface of the sacrificial layer, and performing an oxidation process to form a thermal oxide layer on the surface of the lower portion of the buffer layer. In some embodiments, the method also includes patterning the gate electrode layer to form a metal gate structure, thereby defining a source region and a drain region in the device semiconductor layer. In an embodiment, the fin structure has a circular cross-section. In another embodiment, the fin structure has an elliptical cross-section. In another embodiment, the fin structure has a rectangular cross-section.

According to some embodiments of the present invention, a semiconductor device includes a silicon (Si) substrate and a silicon germanium (SiGe) layer including a lower portion extending over the silicon substrate and a fin structure protruding above the lower portion. A first dielectric layer is disposed over a side surface of the fin structure and a top surface of the lower portion of the silicon germanium (SiGe) layer. An indium gallium arsenide (InGaAs) layer is disposed over a surface of the first dielectric layer. The device also includes a high k dielectric layer disposed over a surface of the InGaAs layer and a metal layer disposed over a surface of the InGaAs layer. In some embodiments, the InGaAs layer includes a source region, a channel region, and a drain region. The metal layer is configured to be a first gate electrode, and the fin structure in the SiGe layer is configured to be a second gate electrode.

In some embodiments of the above method, the InGaAs layer comprises a single crystalline layer. In some embodiments, the fin structure has an elliptical cross-section. In some embodiments, the fin structure has a rectangular cross-section.

According to some embodiments of the invention, a semiconductor device includes a substrate and a first semiconductor layer forming a fin device structure including a lower portion 410 extending over the substrate and a fin structure protruding above the lower portion. A first dielectric layer is disposed over side surfaces of the fin structure and a top surface of the lower portion of the first semiconductor layer. A second semiconductor layer is disposed over a surface of the first dielectric layer, and a second dielectric layer is disposed over a surface of the second semiconductor layer. Further, a conductor layer is disposed over a surface of the second semiconductor layer.

In some embodiments of the above device, the first semiconductor layer can be a silicon germanium (SiGe) layer, and the second semiconductor layer can include one or more of indium gallium arsenide (InGaAs), indium arsenide (InAs), indium antimonide (InSb), or germanium (Ge). In some embodiments, the second semiconductor layer is a single crystalline material. In some embodiments, the fin structure has a rectangular cross-section, and in some other embodiments, the fin structure has a circular cross-section.

The following description, together with the accompanying drawings, will provide further understanding of the nature and advantages of the claimed invention.

DETAILED DESCRIPTION OF THE INVENTION

Figure 1:
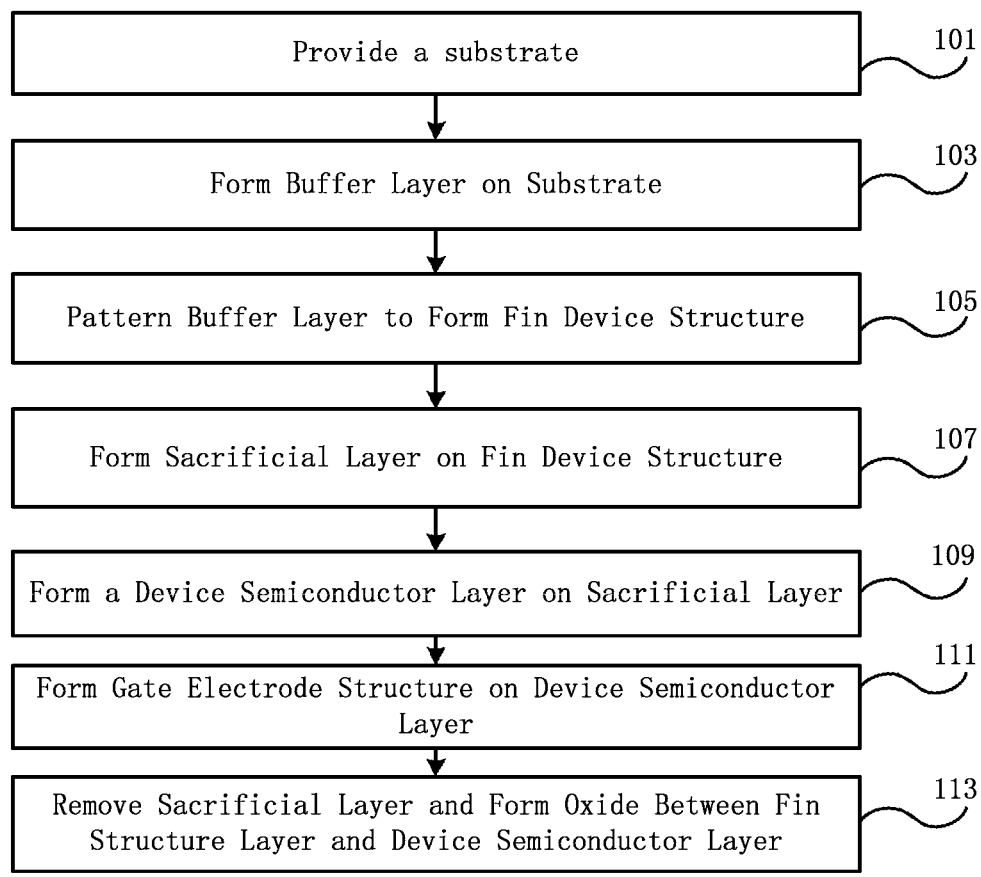
FIG. 1 shows a simplified flow chart of a method for manufacturing a semiconductor device according to an embodiment of the present invention.

Exemplary embodiments of the present invention will be described with reference to the figures. The following description of exemplary embodiments is illustrative only, and not intended to be any limitation on the invention and its application or use. It is understood that the relative arrangement of parts and steps and numeric expressions set forth in these embodiments are not to be construed as limiting the scope of the invention. It is also understood that, for convenience of description, the size of the various components shown in the drawings are not necessarily drawn to actual proportional relationship. Techniques, methods and devices known to one of ordinary skill in the relevant art may not be discussed in detail, but in situations in which these techniques, methods and apparatus apply. These techniques, methods and apparatus should be considered as part of this specification. Further, similar reference numerals and letters are used to refer to similar items in the following figures, and once an item is defined in one of the figures, it will not need to be explained further in the subsequent figures.

Figure 2:
FIGS. 2-6 are cross-sectional view diagrams illustrating a method for forming a semiconductor device according to an embodiment of the present invention.

FIG. 1 shows a simplified flow chart of a method for manufacturing a semiconductor device according to an embodiment of the present invention. As shown in FIG. 1, at step 101, a substrate is provided. FIG. 2 is a cross-sectional view diagram illustrating a substrate 200. In an embodiment, substrate 200 can be a silicon substrate, silicon on insulator (SOI) substrate, etc. However, substrate 200 can also be other suitable semiconductor substrate. In some embodiments, substrate 200 can be a patterned substrate having trenches formed therein, e.g., trenches having a sigma (Σ) shape, which can enhance the adhesion of other materials formed on the substrate.

Figure 3:
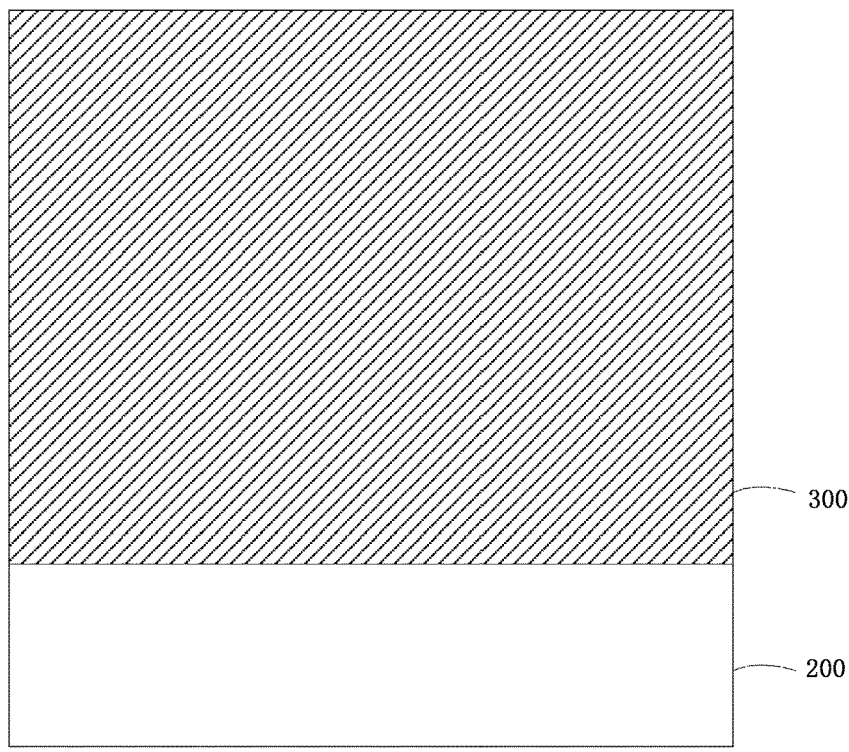

Next, at step 103, a buffer layer 300 is formed on substrate 200, as shown in FIG. 3. In some embodiments, buffer layer 300 can be a semiconductor, e.g., silicon germanium (SiGe) or other material. In some embodiment, buffer layer 300 can be formed using an epitaxial process, such as metal organic chemical vapor deposition (MOCVD) or molecular beam epitaxy (MBE). In some embodiments, the thickness of buffer layer 300 can be about 10-500 nm.

Figure 4:
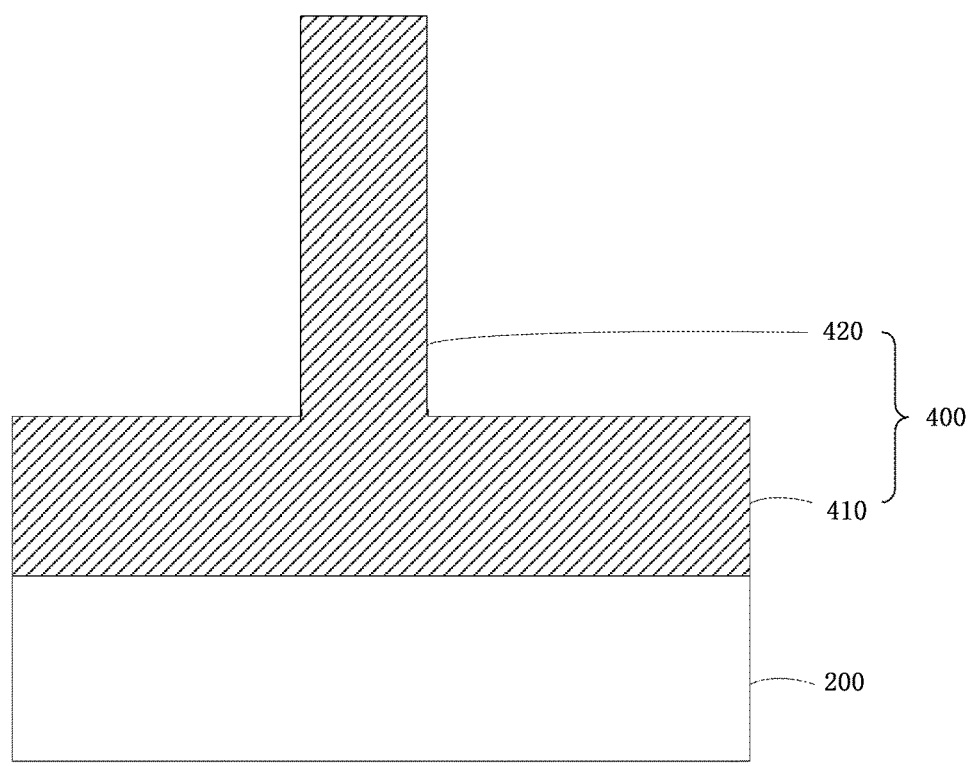

Next, at step 105, buffer layer 300 is patterned to form a fin structure, using, e.g., photolithography and dry etching processes. As shown in FIG. 4, a fin device structure 400 include a fin structure 420 and a lower portion 410 made from the buffer layer formed on substrate 200. Here, the shape of the fins 420 may be cylindrical, elliptic cylindrical, or rectangular parallelepiped. Further, fin structure 420 may also be in the shape of a cube. In other words, from a top view, fin structure 420 can have a cross section that is circular, elliptical, square, or rectangular. In some embodiments, the height of fin 420 may be 10-200 nm, and the width of fin 420 may be 10-50 nm. It should be understood, the shape of the fins are merely exemplary and not intended to limit the scope of the invention.

In a specific implementation, fin device structure 400 may be formed by the following processes: forming a patterned etch mask on buffer layer 300, such as a photoresist mask. With the patterned resist as a mask, buffer layer 300 is etched to form fin device structure 400. In one embodiment, the fin structure can be configured as an adjust gate electrode, or a back gate electrode, which can be used to adjust the threshold voltage of the device to be formed in subsequent processes.

Figure 5:
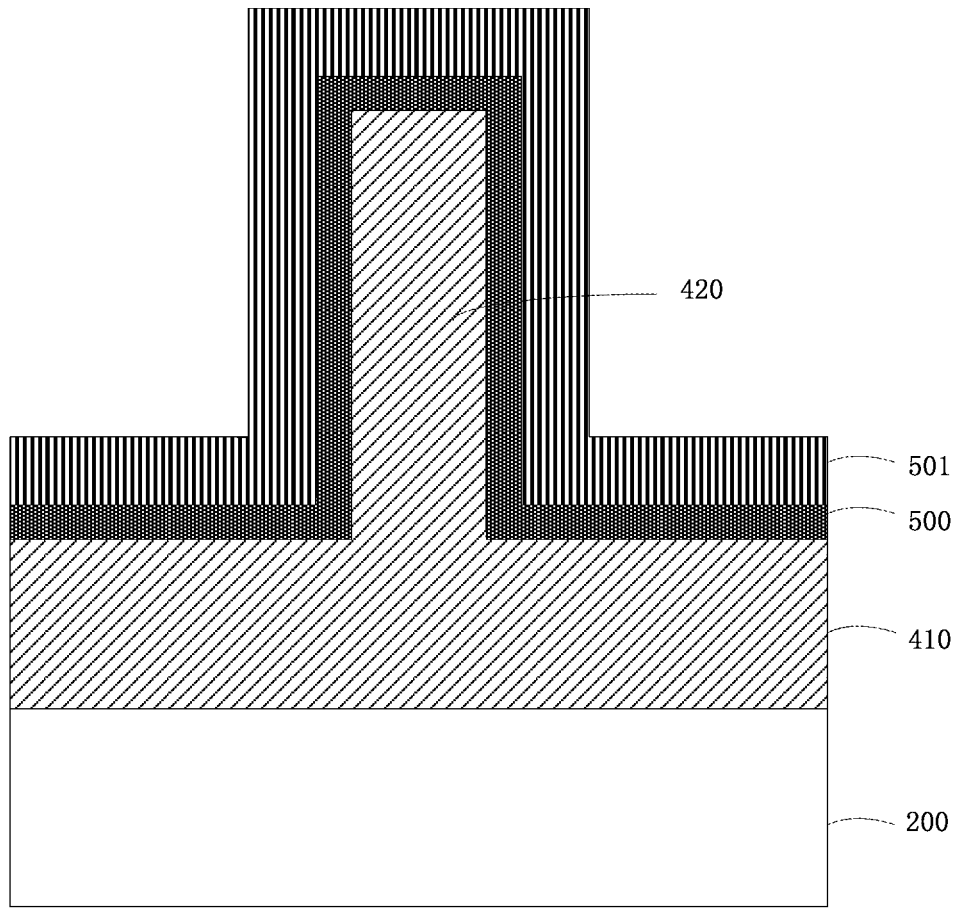

Next, at step 107, as illustrated in FIG. 5, a sacrificial layer 500 is formed on the upper surface and the side surface of fin structure 420 and the upper surface of the lower portion of the buffer layer 410. As an example, a selective epitaxial growth process can be used for form sacrificial layer 500. In some embodiments, the material, sacrificial layer 500 may be aluminum arsenide (AlAs). In some embodiments of the invention, sacrificial layer 500 is used as a seed layer for the formation of a device semiconductor layer to be described below. Therefore, sacrificial layer 500 has the proper lattice match properties for the formation of a device semiconductor layer.

At step 109, as illustrated in FIG. 5, a device semiconductor layer 501 is formed on sacrificial layer 500 using, e.g., a selective epitaxial growth process. Device semiconductor layer 501 includes an upper portion, a middle portion, and a lower portion. As described below, the middle portion will be configured as a channel region of the device, and the upper and lower portions will be configured as the source or drain regions. In some embodiments, the thickness of the device semiconductor material layer 501 can have a thickness in the range of 1-10 nm, e.g., 2 nm, 5 nm, or 8 nm, etc. In some embodiments, the semiconductor material layer 501 may include one of the following: indium gallium arsenide (InGaAs), indium arsenide (InAs), indium antimonide (InSb), or germanium (Ge). In some embodiments, device semiconductor layer 501 may include combinations of one or more of the materials listed above. An appropriate material can be selected for the sacrificial layer and the layer of semiconductor material according to the type of device. For example, for an N-type field effect transistor (NFET), AlAs can be used as the sacrificial layer, and InGaAs, InAs or InSb can be used as the material for the device semiconductor layer. For a P-type field effect transistor (PFET), AlAs can be used as the sacrificial layer material, and Ge layer as a semiconductor material.

Further, semiconductor device layer 501 can be formed using an epitaxial process including in-situ doping. For example, semiconductor device layer 501 can be doped with n-type or p-type impurities. In some embodiments, semiconductor device layer 501 can be n+ or p+ doped. In some embodiments, an InGaAs semiconductor device layer 501 is n+ doped, and a Ge semiconductor device layer 501 is p+ doped. In some embodiments, semiconductor device layer 501 is doped in the same type, i.e., either n-type or p-type. Therefore, the channel region of the device has the same doping type as the source and drain regions, which can form a junctionless devices.

Figure 6:
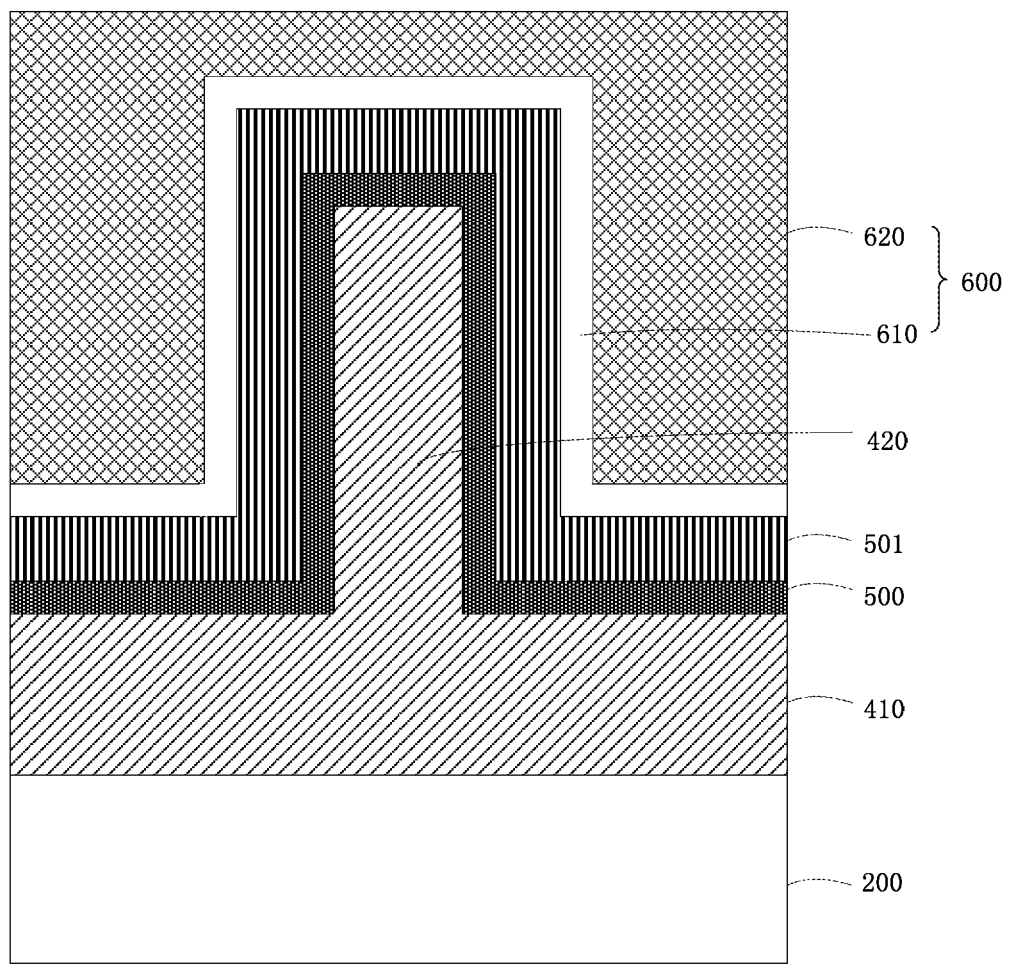

Then, as shown in FIG. 6, at step 111, a control gate structure layer 600 is formed on semiconductor device layer 501. The control gate structure 600 includes a control gate dielectric layer 610 on the surface of semiconductor device layer 501 and a control gate electrode 620 on control gate dielectric layer 610. In some embodiments, control gate electrode 620 may be a dummy polysilicon gate, which may be replaced by a metal gate at a subsequent step. In other embodiments, the control gate electrode material 620 may include a metal or metal alloy, such as aluminum, titanium, and the like. In some embodiments, control gate dielectric material 610 may be a layer of silicon oxide or a high-k dielectric material (e.g., hafnium oxide, zirconium oxide, etc.). In some embodiments, the range of thickness of the gate dielectric layer 610 can be 1-5 nm, e.g., 3 nm. Those skilled in the art will appreciate that a known method can be used to form a control gate electrode structure shown in FIG. 6 having high-K dielectric material and metal gate.

Figure 7A:
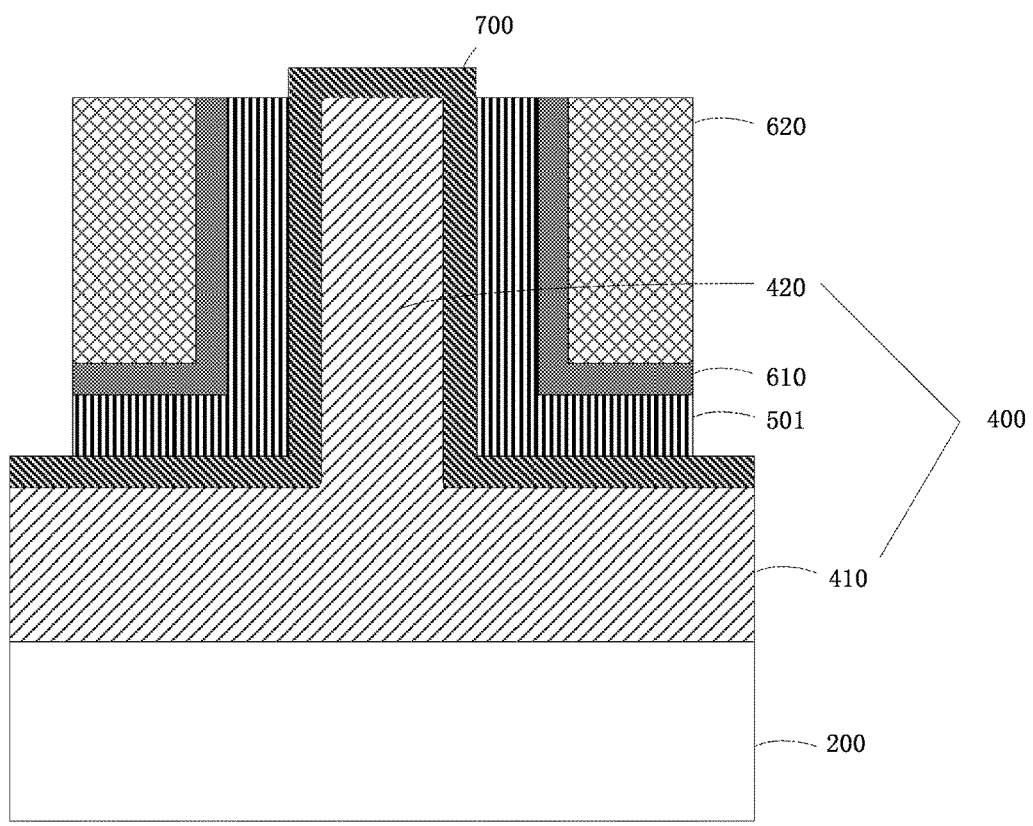
FIGS. 7A and 7B are, respectively, a vertical cross-sectional view diagram and a horizontal cross-sectional view diagram showing a device structure according to an embodiment of the present invention.
Figure 7B:
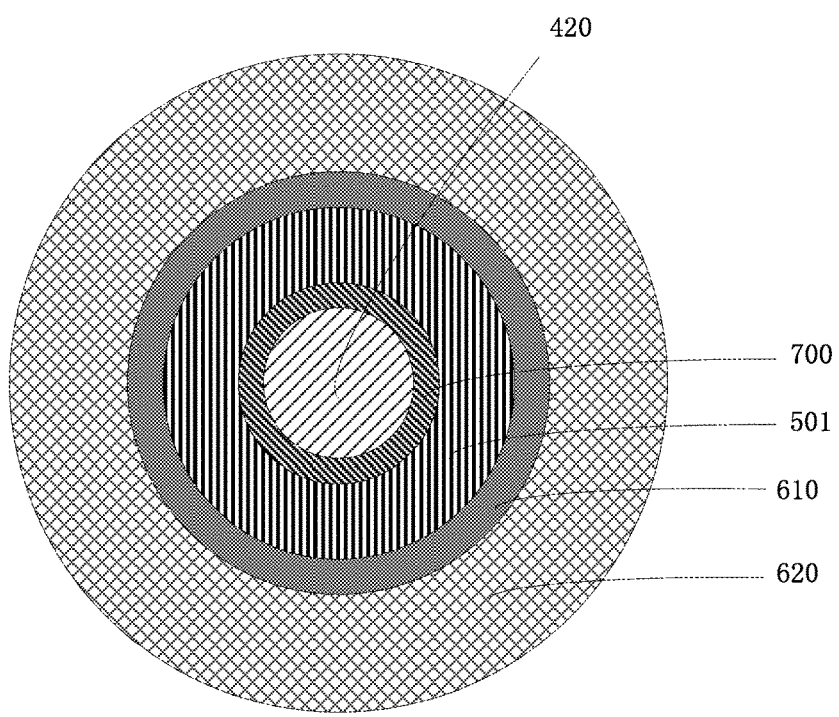

Then, at step 113, the sacrificial layer is removed, and an oxide layer is formed between the fin structure 420 and device semiconductor layer 501. FIGS. 7A and 7B are, respectively, a vertical cross-sectional view diagram and a horizontal cross-sectional view diagram showing a device structure after step 113. As an example, sacrificial layer 500 between the fin structure 420 and device semiconductor layer 501 can be removed using diluted hydrofluoric acid (DHF). Then, a high temperature oxidation of the fin structure can be carried out to form an oxide layer 700. Oxide layer 700 is configured as the gate dielectric layer for an adjustment gate, also referred to as the adjustment gate dielectric layer. Here, FIG. 7B, in a horizontal cross-sectional view, shows a cylindrical fin device which includes a control gate electrode 620, a control gate dielectric layer 610, a device semiconductor layer 501, an adjustment gate dielectric layer 700, and a fin structure 420 as the adjustment gate. In the top cross-sectional view, these device layers are all shown to be circular. However, as described above, the fin structure can have different shapes. For example, if the fin is rectangular, then, correspondingly, the control gate electrode, the control gate dielectric layer, the semiconductor layer, and the gate dielectric layer may be shown as rectangular rings in a top-down cross-sectional view.

Depending on the embodiments, different methods can be used to remove the sacrificial layer and form an oxide layer between the fin structure 420 and device semiconductor layer 501. For example, FIGS. 8-13 are cross-sectional view diagrams illustrating a method for forming the device structure of FIG. 7A according to an embodiment of the present invention.

Figure 8:
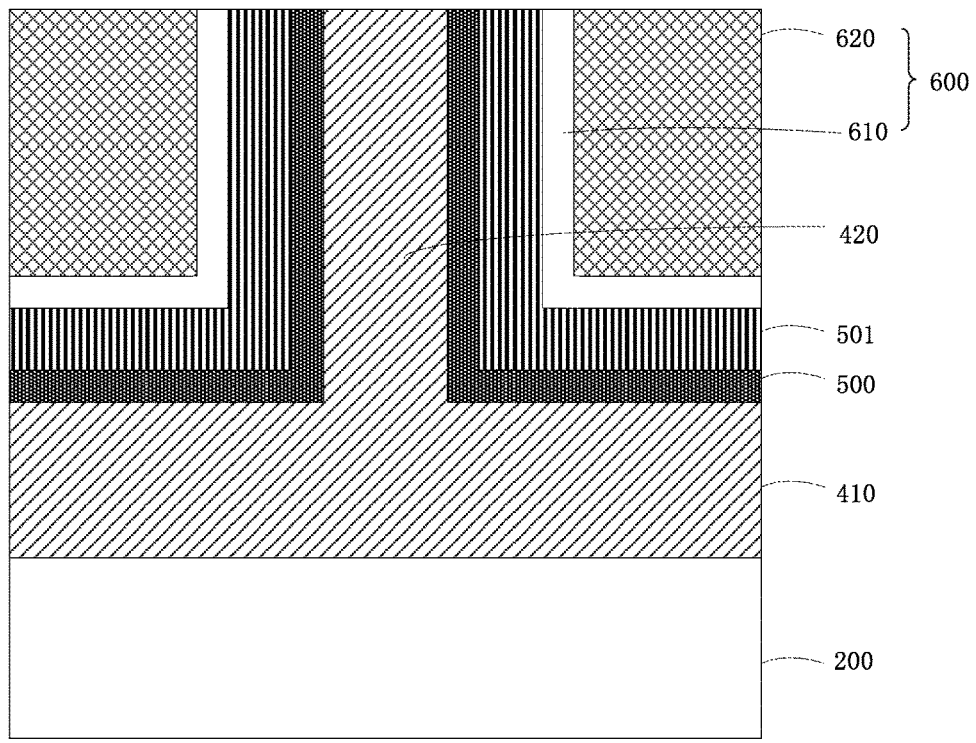
FIGS. 8-13 are cross-sectional view diagrams illustrating a method for forming the device structure of FIG. 7A according to an embodiment of the present invention.

In FIG. 8, after the formation of the control gate electrode structure, a planarization process, e.g., chemical mechanical polishing (CMP), is used to expose the upper surface of fin structure 420.

Figure 9:
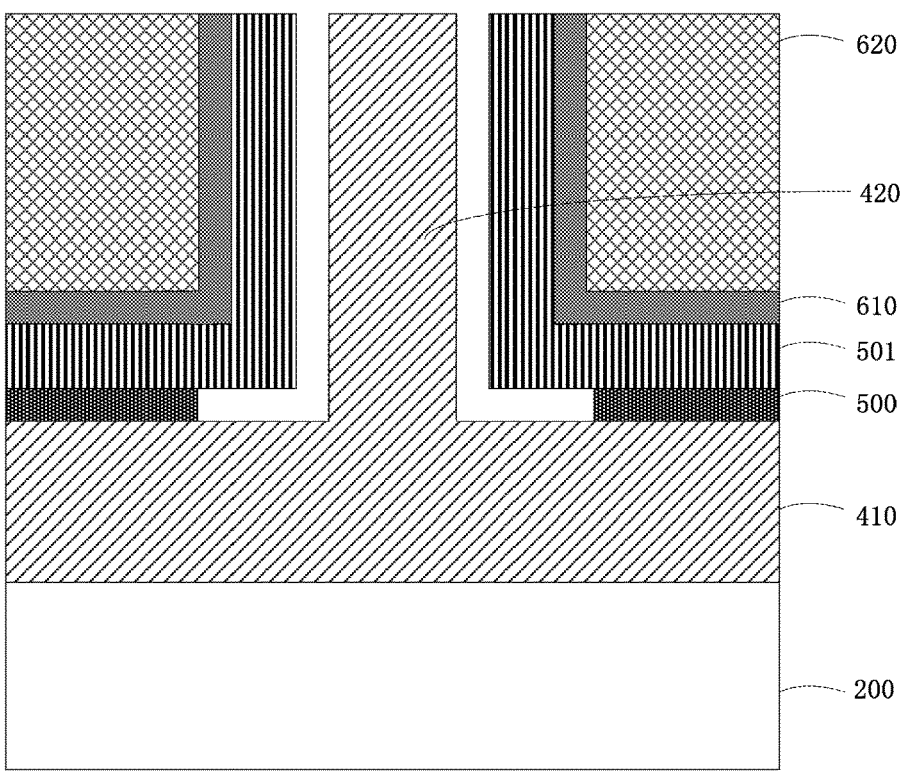

As shown in FIG. 9, sacrificial layer 500 on the side walls of the fin is removed. In an embodiment, the DHF can be used. The etching time can be selected based on the etch rate and the height of the fin structure. In some embodiments, as shown in FIG. 9, the sacrificial layer 500 on the surface portions of the lower portion of buffer layer 410 is also removed. In other embodiments, the sacrificial layer may be removed only on the side of the fin structure 420.

Figure 10:
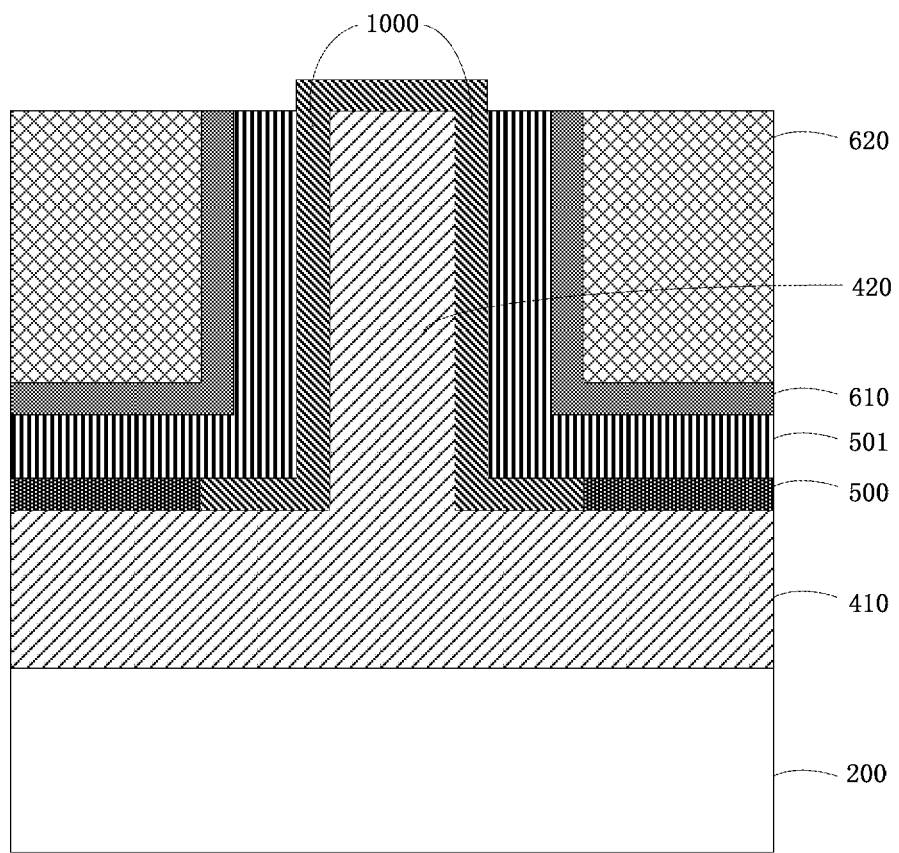

Thereafter, as shown in FIG. 10, an oxidation process 1000 is carried out to oxidize the upper surface and the side surfaces of the fin structure where the sacrificial layer has been removed. Illustratively, the oxidation can be carried out in the temperature range of 800° C.-1200° C. and in an atmosphere containing oxygen or water vapor in. Here, the term "fins oxide layer" refers to the oxide layer formed by thermal oxidation on the surface of the fin (including the upper surface and side surface). As described above, in some embodiments, the sacrificial layer on the surface portion of buffer layer 410 may also be removed. Thus, the term "fins oxide layer" may also include an oxide layer formed by thermal oxidation on the surface of the lower portion of buffer layer 410 where the sacrificial layer has been removed.

Figure 11:
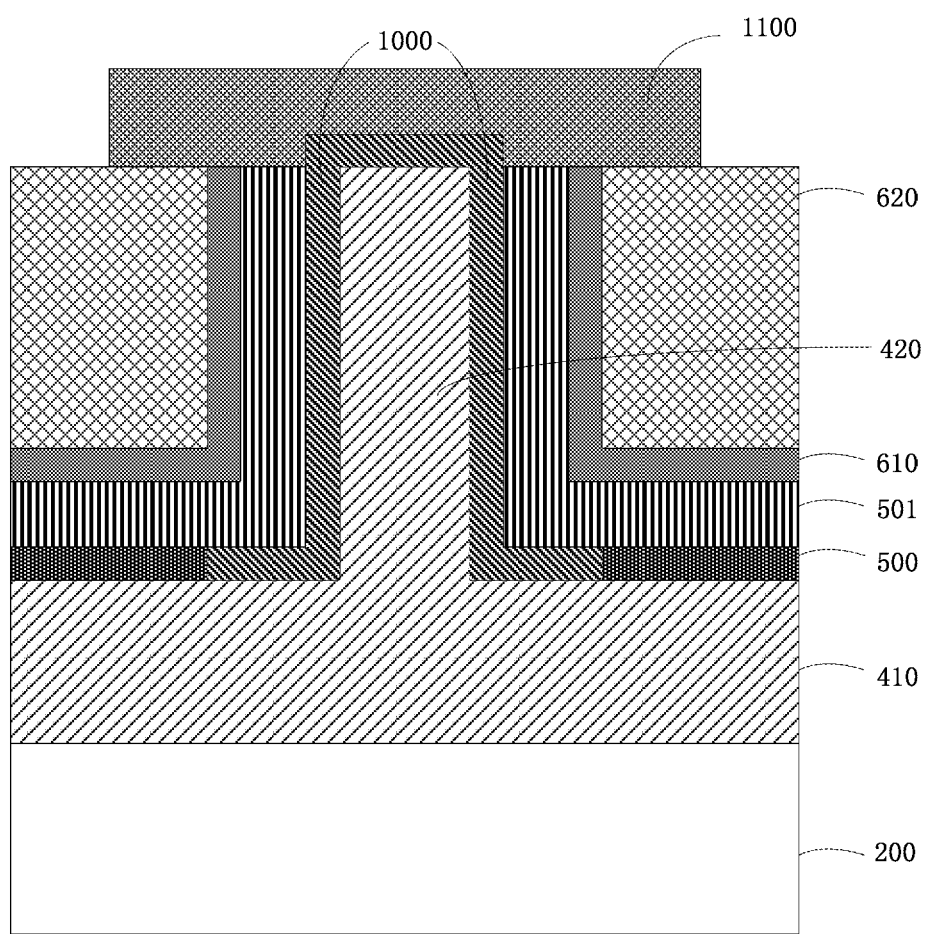

Next, as shown in FIG. 11, a patterned hard mask 1100 is formed covering the upper surface of oxide layer 1000 of the fin, the upper surface of device semiconductor layer 501, the upper surface of control gate dielectric layer 610, and a surface portion of control gate electrode 620. In some embodiments, the hard mask 1100 may be a silicon nitride or silicon oxide, and the like.

Figure 12:
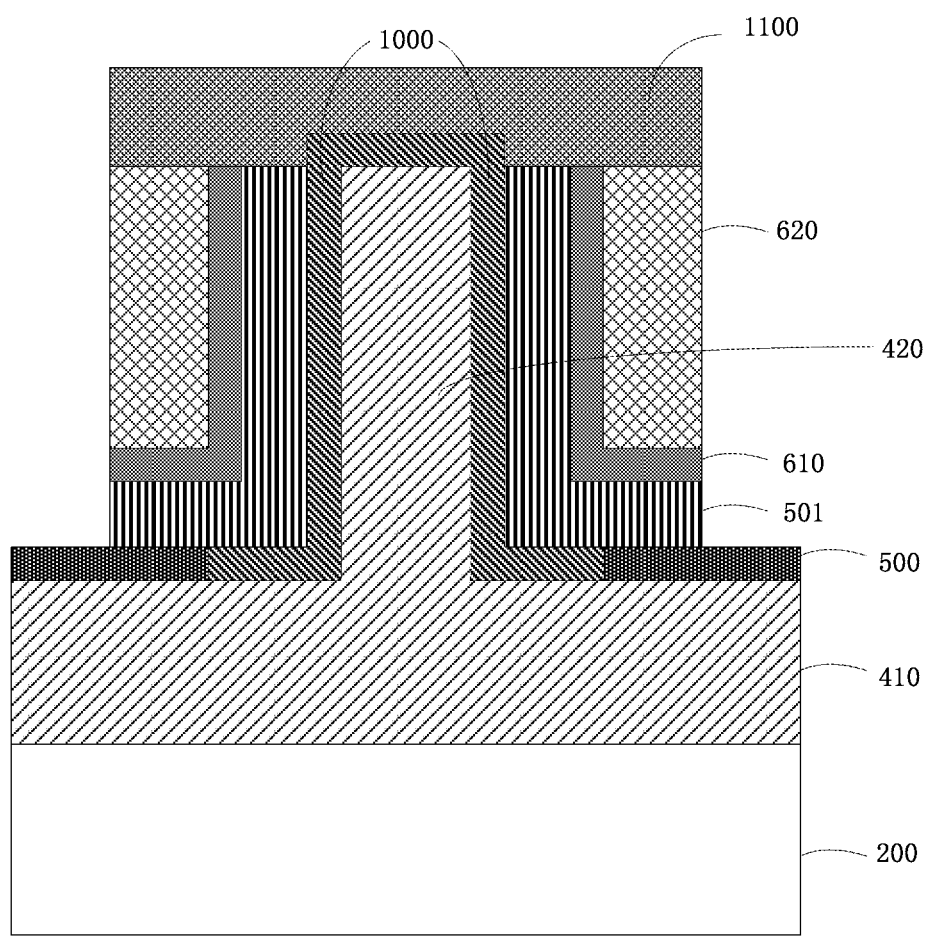

Then, as shown in FIG. 12, using the patterned hard mask 1100 as an etch mask and a portion of sacrificial layer 500 on buffer layer 410 as an etch stop, a etch process is carried out to remove portions of control gate electrode 620, control gate dielectric layer 610, and device semiconductor layer 501. Note that, here, hard mask 1100 may be a photoresist.

Figure 13:
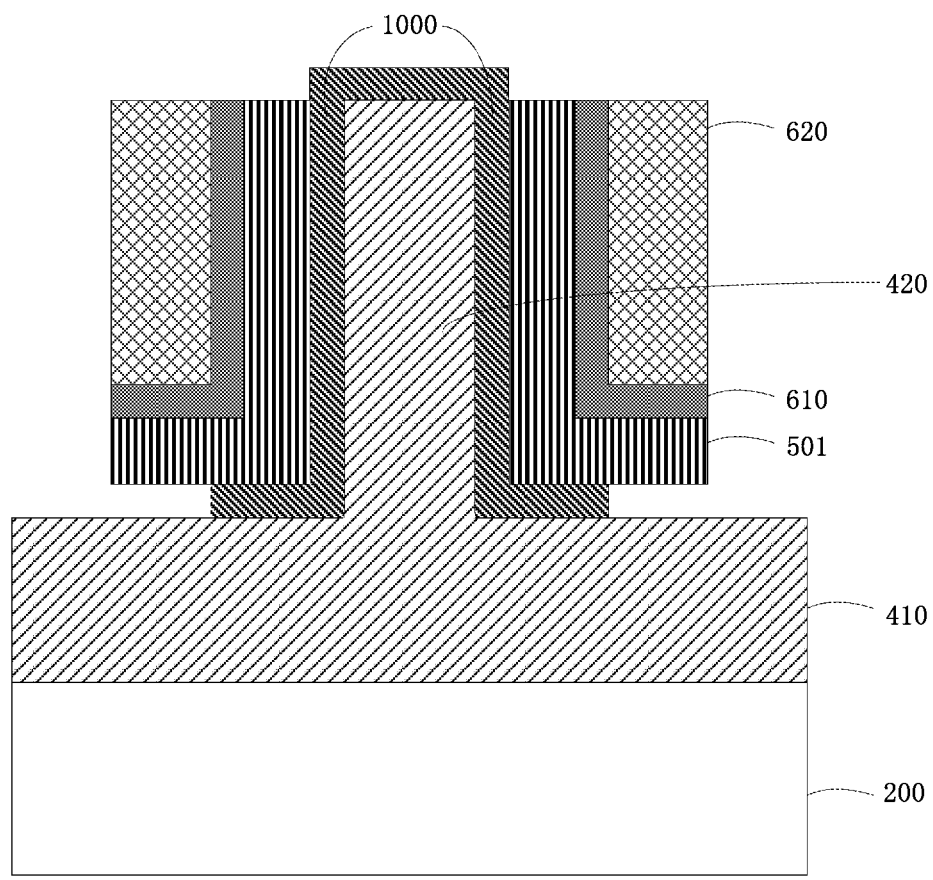

Subsequently, as shown in FIG. 13, the remaining portions of sacrificial layer 500 on buffer layer 410 are removed using DHF. Then, the hard mask can be removed.

Thereafter, after the sacrificial layer is removed, the exposed surface portions of buffer layer 410 oxidize at a high temperature (e.g., in the range of 800° C.-1200° C.) to form an oxide layer between the fin device structure 400 and device semiconductor material layer 501, thereby forming the structure shown in FIGS. 7A and 7B. The oxidation can be carried out in an atmosphere containing oxygen or water vapor. It should be noted that, in FIGS. 7A and 7B, the oxide layer 700 includes both the oxide layer on a fin surface (including the upper surface and side) of both and the oxide layer formed by oxidizing the surface of the buffer layer is formed by oxidation.

FIGS. 14-18 are cross-sectional view diagrams illustrating a method for forming the device structure of FIG. 7A according to another embodiment of the present invention. Compared with the method depicted in FIGS. 8-13, in this embodiment, portions of the sacrificial layer on the lower portions of the buffer layer are removed, and the exposed surface of the lower buffer layer is oxidized. Then, the portions of the sacrificial layer surrounding the fin structure are removed and replaced by thermal oxide.

Figure 14:
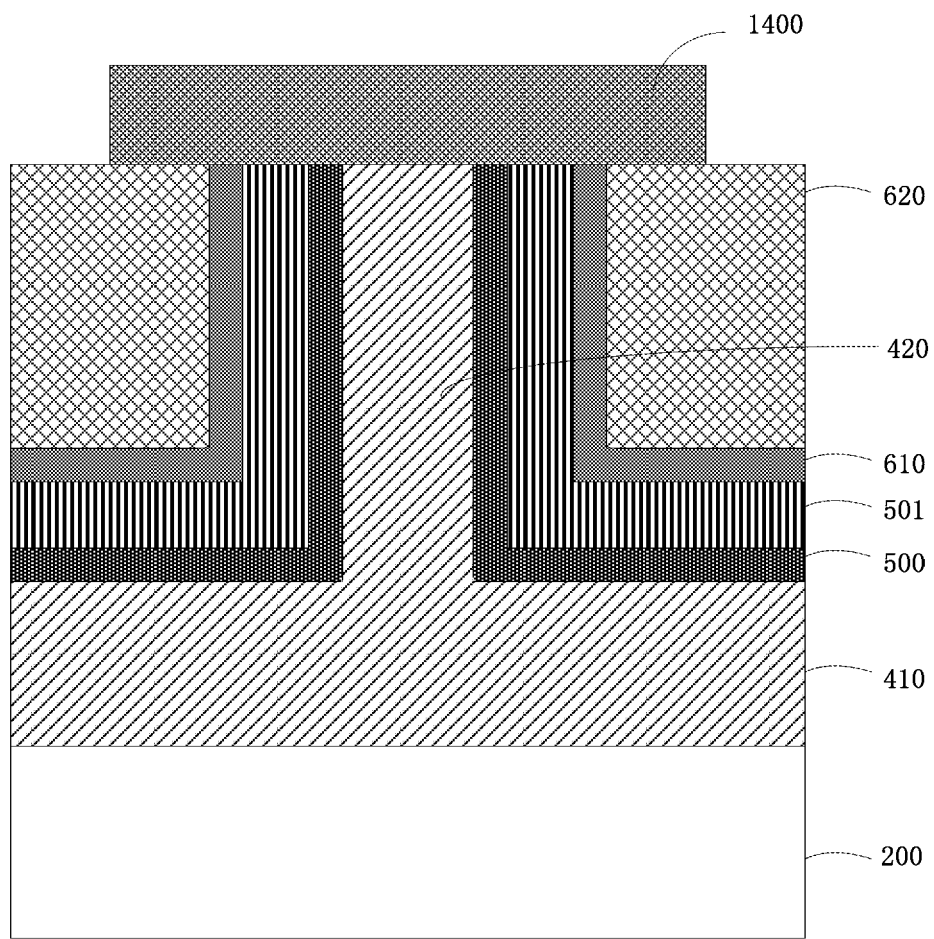
FIGS. 14-18 are cross-sectional view diagrams illustrating a method for forming the device structure of FIG. 7A according to another embodiment of the present invention

As shown in FIG. 14, a patterned hard mask 1400 is formed. The hard mask 1400 may be a silicon nitride or silicon oxide, and the like.

Figure 15:
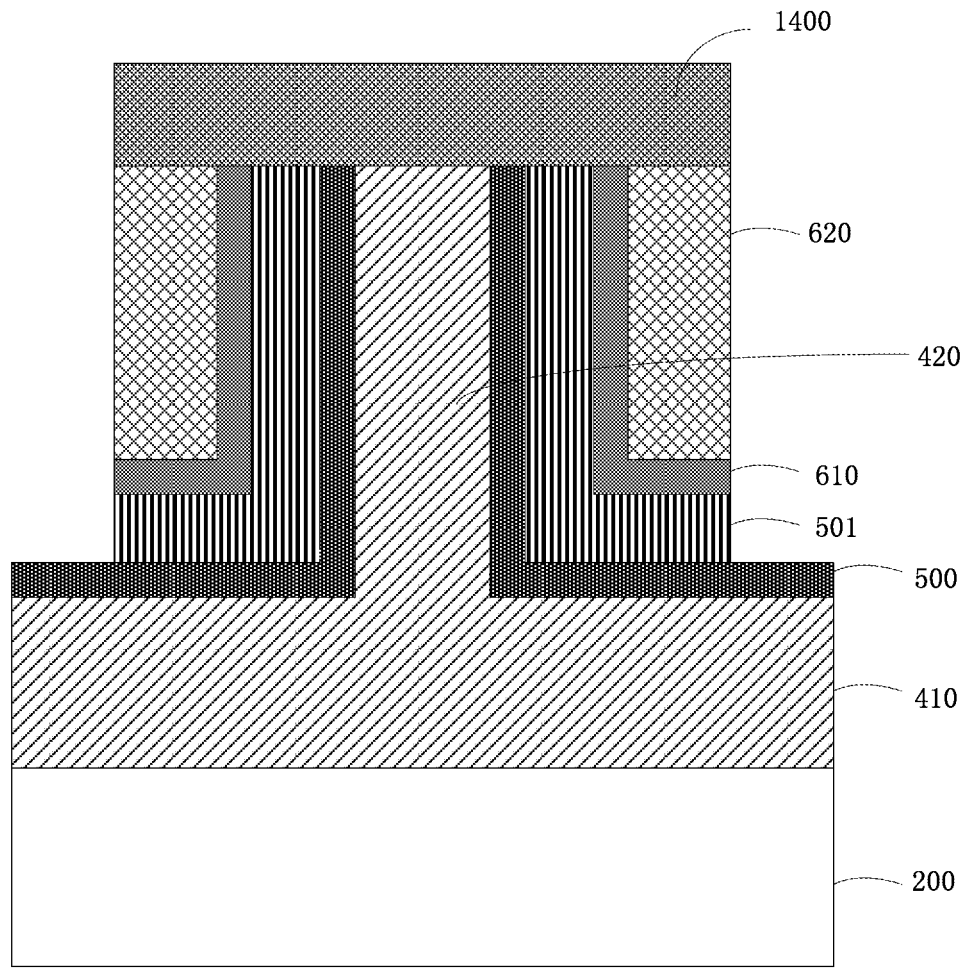

Subsequently, as shown in FIG. 15, using the patterned hard mask 1400 as an etch mask and a portion of sacrificial layer 500 on buffer layer 410 as an etch stop, an etch process is carried out to remove portions of control gate electrode 620, control gate dielectric layer 610, and device semiconductor layer 501. Note that, here, hard mask 1400 may be a photoresist.

Figure 16:
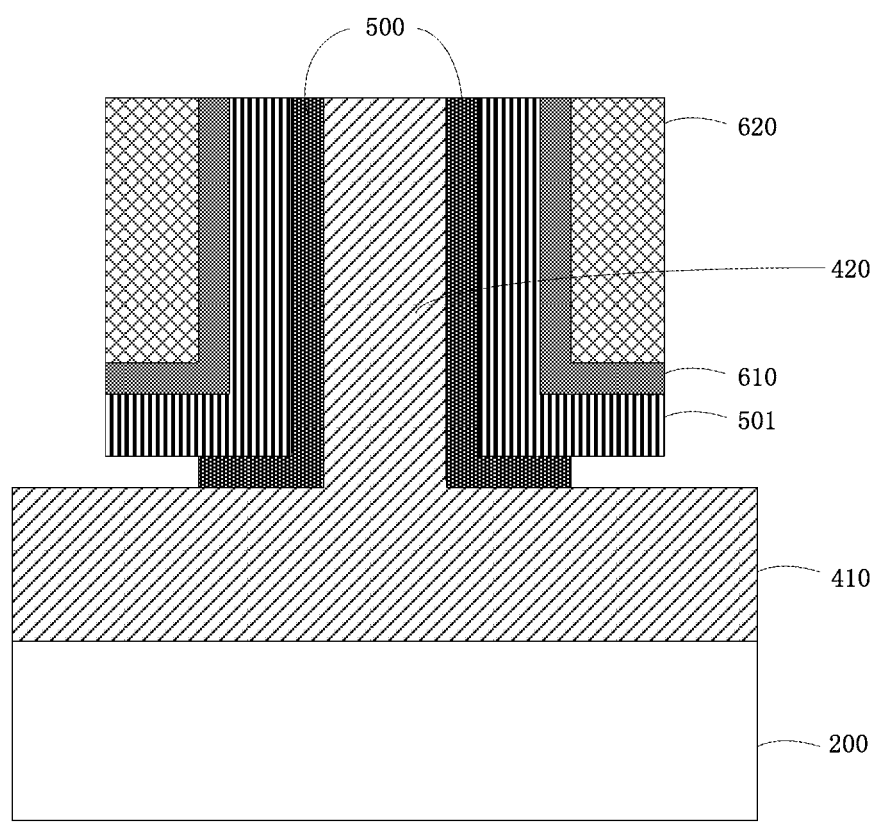

Subsequently, as shown in FIG. 16, part or all of lower portions of sacrificial layer 500 on buffer layer 410 are removed using DHF. Then, the hard mask can be removed.

Figure 17:
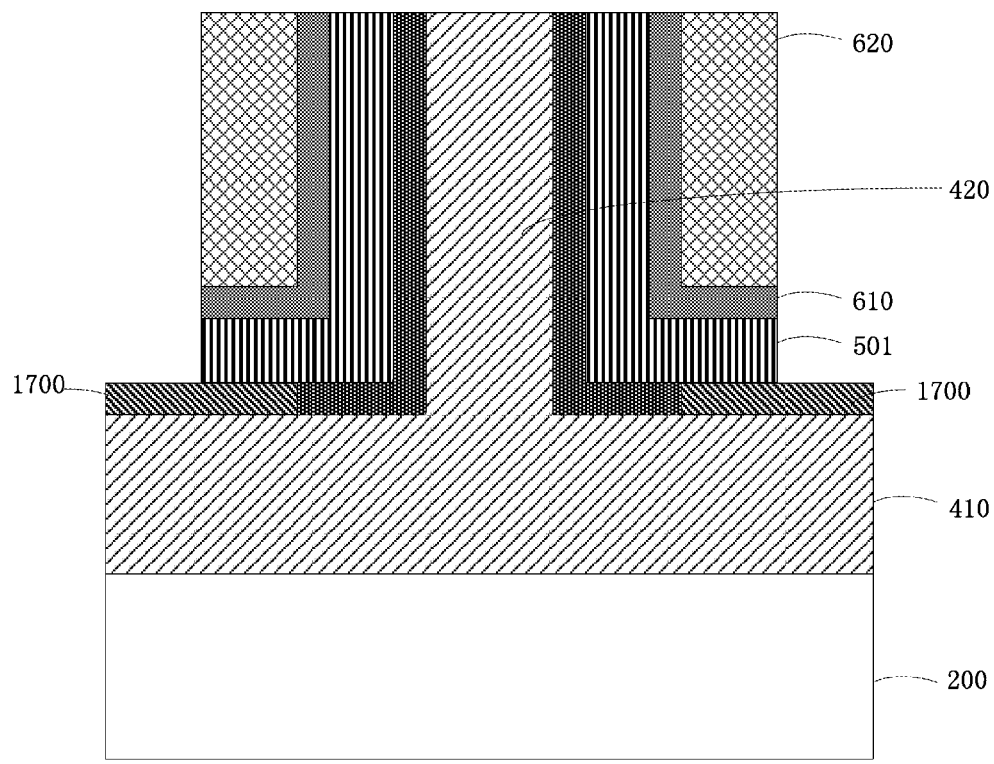

Next, as shown in FIG. 17, a high temperature oxidation is carried out to form an oxide layer 1700 on the exposed surface of the buffer layer. The oxidation can be carried out in the temperature range of 800° C.-1200° C. and in an atmosphere containing oxygen or water vapor.

Figure 18:
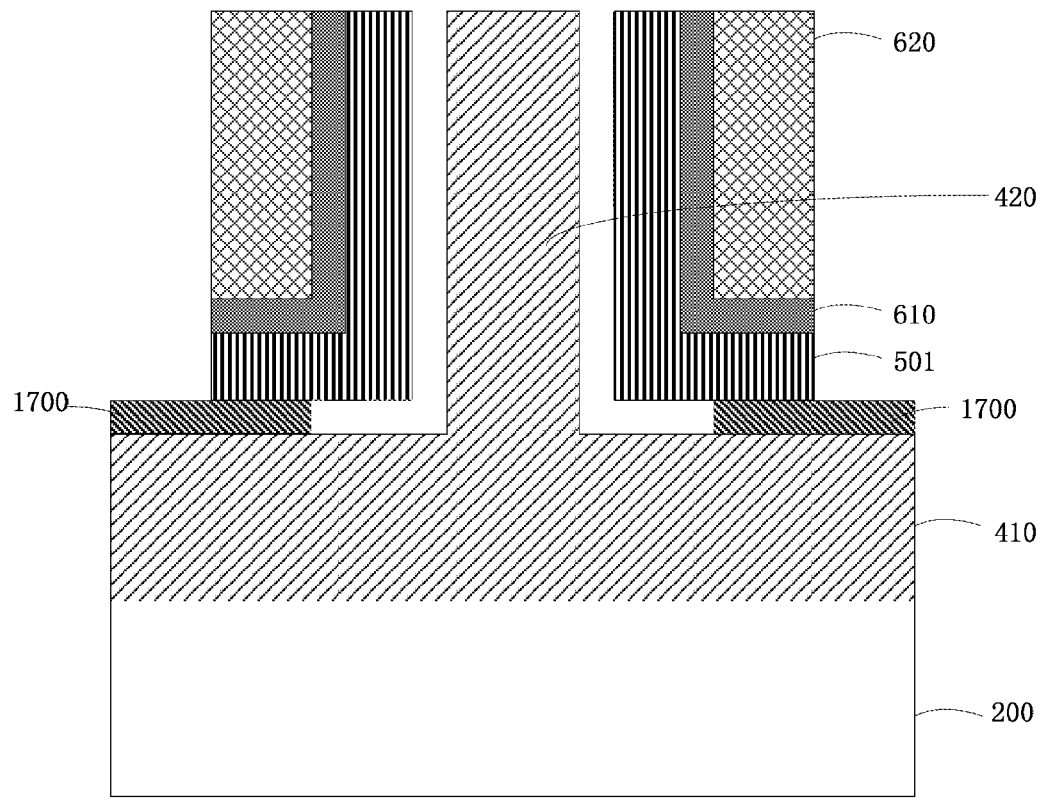

In FIG. 18, a wet etching process, e.g., using DHF, is used to remove the sacrificial layer of the portions of sacrificial layer 500 on the sidewalls of fins 420 on the side 500.

Then, an oxidation process is carried out to form an oxide layer on the upper surface and the side surfaces of the fin after removal of the sacrificial layer, thereby forming the structure shown in FIGS. 7A and 7B.

As described above, embodiments of the present invention provide a method of manufacturing a semiconductor device having a vertical junctionless transistor structure. As a result of the SiGe buffer layer and the AlAs sacrificial layer (seed layer), it overcomes the prior art atomic lattice mismatch problem in conventional methods. The semiconductor device is formed as a vertical structure without source and drain PN junctions and can effectively suppress the short channel effect. Further, a back gate electrode is provided that can effectively adjust the threshold voltage of the transistor. In some embodiments, the material of the buffer layer can include a SiGe. The sacrificial material layer can include AlAs. The device semiconductor layer can include one or more of InGaAs, InAs, and InSb. In some embodiment, the device semiconductor layer can include Ge. It should be understood that the present disclosure is not limited to these materials.

Figure 19:
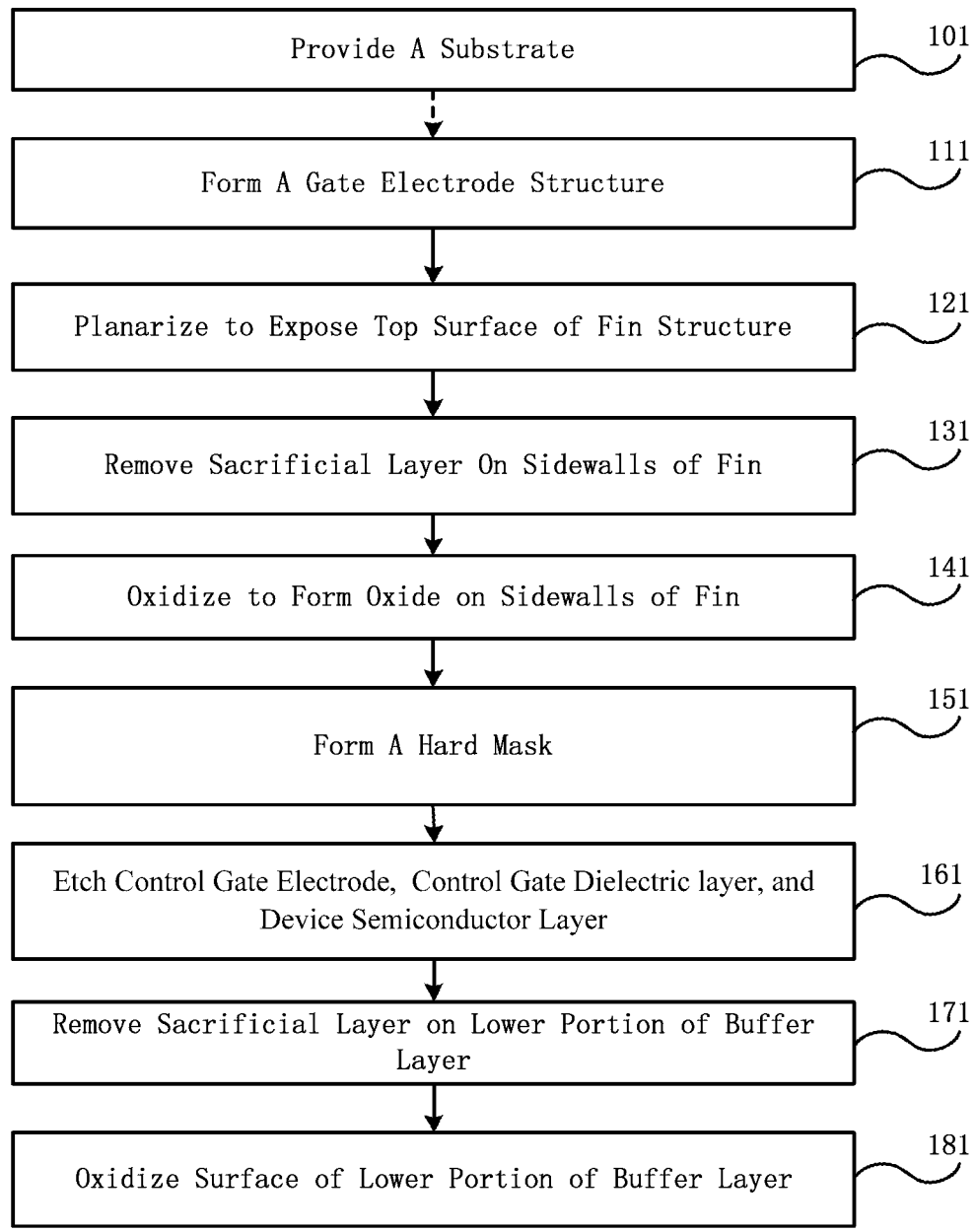
FIG. 19 shows a simplified flow chart of a method for manufacturing a semiconductor device according to another embodiment of the present invention.

FIG. 19 shows a simplified flow chart of a method for manufacturing a semiconductor device according to another embodiment of the present invention. The flow chart in FIG. 19 describes the processes described above with reference to FIGS. 8-13 to carried out step 113 shown in FIG. 1. Step 113 includes removing sacrificial layer and forming oxide between fin structure layer and device semiconductor layer. In FIG. 19, steps 101 and 111 from FIG. 1 are shown, and steps 102-109 from FIG. 1 are omitted. The method can be summarized as follows.

At step 121, planarize to expose the upper surface of the fin.

At step 131, remove sacrificial layer on the side of the fin;

At step 141, remove the sacrificial layer on the upper surface and side surfaces of the fin, and oxidized to form an oxide layer.

At step 151, form a patterned hard mask.

At step 161, etch the control gate electrode, the control gate dielectric layer, and the device semiconductor layer.

At step 171, remove the sacrificial layer on the surface of the buffer layer.

At step 181, oxidize the surface of the buffer layer, whereby an oxide layer is formed between the fin device structure and the layer of semiconductor material.

Figure 20:
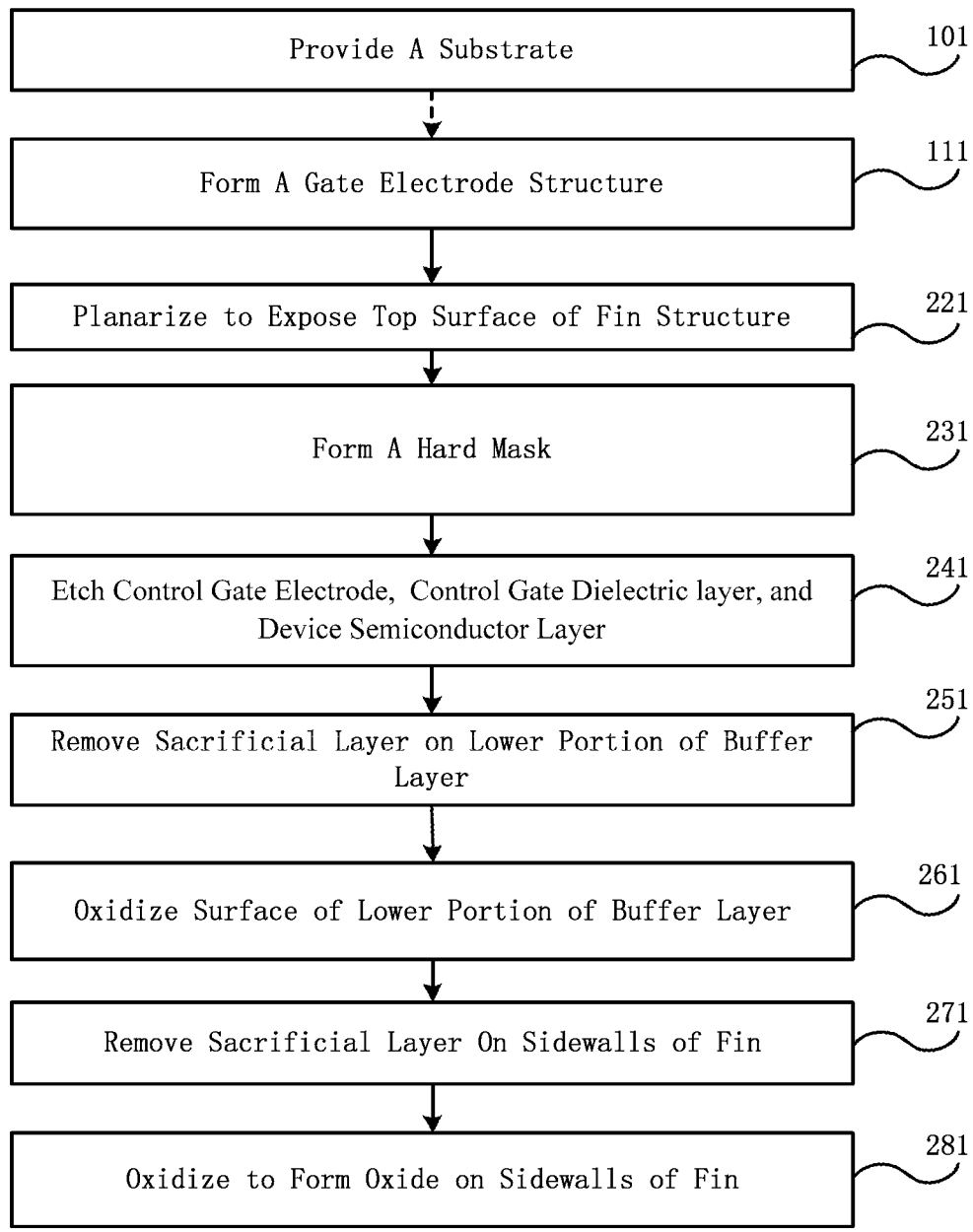
FIG. 20 shows a simplified flow chart of a method for manufacturing a semiconductor device according to yet another embodiment of the present invention.

FIG. 20 shows a simplified flow chart of a method for manufacturing a semiconductor device according to yet another embodiment of the present invention. The flow chart in FIG. 20 describes the processes described above with reference to FIGS. 14-18 to carried out step 113 shown in FIG. 1. Step 113 includes removing sacrificial layer and forming oxide between fin structure layer and device semiconductor layer. In FIG. 20, steps 101 and 111 from FIG. 1 are shown, and steps 102-109 from FIG. 1 are omitted. The method can be summarized as follows.

At step 221, planarize to expose the upper surface of the fin.

At step 231, form a patterned hard mask.

At step 241, etch the control gate electrode, the control gate dielectric layer, and the device semiconductor layer.

At step 251, remove the buffer layer on the sacrificial layer surface.

At step 261, oxidize the exposed surface of the buffer layer.

At step 271, remove the sacrificial layer from on the side of the fin.

At step 281, oxidize the side surfaces of the fin layer, whereby an oxide layer is formed between the fin structure and the layer of device semiconductor layer.

The methods summarized in FIGS. 19 and 20 can also include reducing the gate electrode material to form the control gate electrode, thereby defining source and drain regions.

Figure 21:
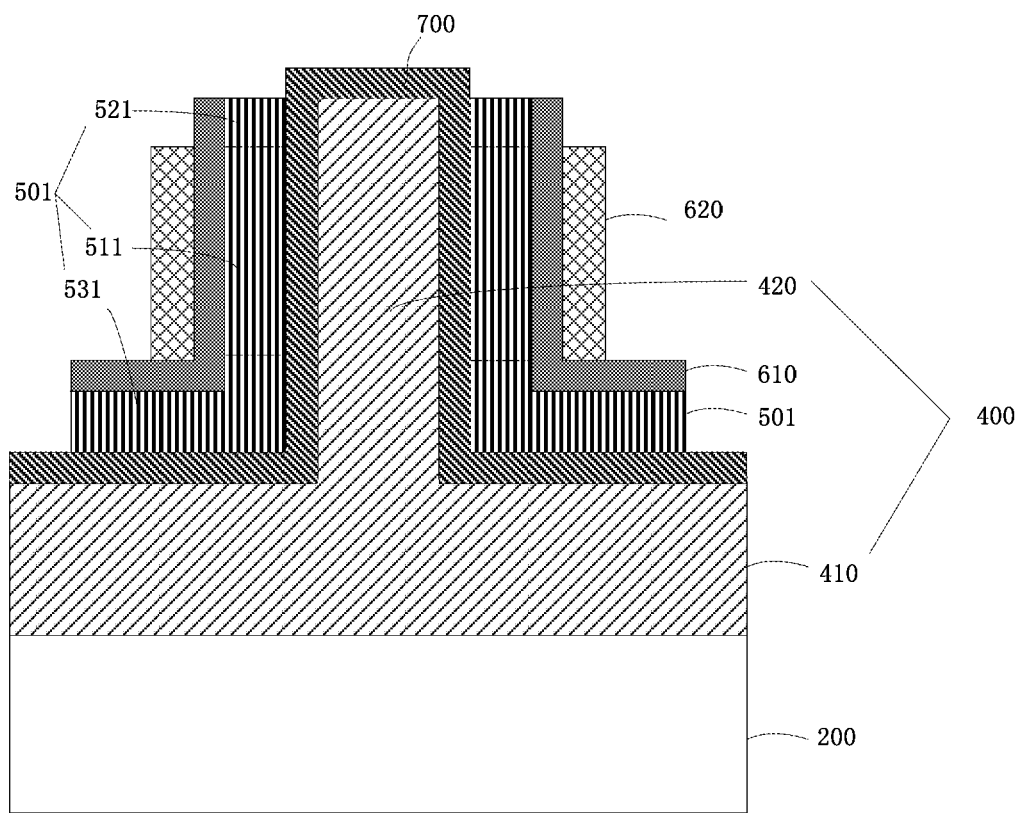
FIG. 21 is a cross-sectional view diagram showing a device structure according to an embodiment of the present invention.

FIG. 21 is a cross-sectional view diagram showing a device structure according to an embodiment of the present invention. According to some embodiments of the invention, a semiconductor device includes a substrate 200 and a first semiconductor layer 400 including a lower portion 410 extending over the substrate and a fin structure 420 protruding above the lower portion. A first dielectric layer 700 is disposed over a side surface of the fin structure and a top surface of the lower portion of the first semiconductor layer. A second semiconductor layer 501 is disposed over a surface of the first dielectric layer, and a second dielectric layer 610 is disposed over a surface of the second semiconductor layer. Further, a conductor layer 620 is disposed over a surface of the second semiconductor layer.

In some embodiments, the second semiconductor layer 610 includes a source region, a channel region, and a drain region. As shown in FIG. 21, the channel region 511 is opposite the gate electrode 620, and regions 521 and 531 in the second semiconductor layer are the source and drain regions. The conductive layer is configured to be a first gate electrode, also referred to as the control gate electrode, and the fin structure in the first semiconductor layer is configured to be a second gate electrode, also referred to as the back gate electrode.

In an embodiment, the thickness of device semiconductor layer 501 is 1-10 nm, for example, 2 nm, 5 nm, or 8 nm. In an embodiment, the thickness of electric control gate dielectric layer 610 is 1-5 nm, for example, 3 nm. In an embodiment, the height of the fin structure 420 is 10-200 nm, and the width of fin structure 420 10-50 nm. In an embodiment, buffer layer material 410 includes SiGe, device semiconductor layer 501 includes one or more of the following materials: InGaAs, InAs, InSb, or Ge. In an embodiment, control gate dielectric layer 610 includes a high-k dielectric material. The control gate electrode 620 includes a metal material. In an embodiment, the shape of fin structure 420 may include cylindrical, elliptic cylindrical, and rectangular parallelepiped. Further, the shape of the fin 420 may be a cube.

Although certain embodiments of the present invention are described in detail, those skilled in the art will appreciate that the above examples are for illustration only and not to limit the scope of the invention. Thus, those skilled in the art would appreciate that, aside from embodiments of the present disclosure, various modifications and changes can be made without departing from the spirit and scope of the present disclosure.

What is claimed is:

1. A semiconductor device, comprising:
   a silicon (Si) substrate;
   a silicon germanium (SiGe) layer including a lower portion extending over the silicon substrate and a fin structure protruding above the lower portion;
   a first dielectric layer disposed over a side surface of the fin structure and a top surface of the lower portion of the silicon germanium (SiGe) layer;
   an indium gallium arsenide (InGaAs) layer disposed over a surface of the first dielectric layer;
   a high k oxide layer disposed over a surface of the InGaAs layer;
   a metal layer disposed over a surface of the high k oxide layer;
   wherein:
      the InGaAs layer includes a source region, a channel region, and a drain region,
      the metal layer is configured to be a first gate electrode, and
      the fin structure in the SiGe layer is configured to be a second gate electrode.

2. The device of claim 1, wherein the InGaAs layer comprises a single crystalline layer.

3. The device of claim 1, wherein the fin structure has an elliptical cross-section.

4. The device of claim 1, wherein the fin structure has a rectangular cross-section.

5. A semiconductor device, comprising:
   a substrate;
   a first semiconductor layer including a lower portion extending over the substrate and a fin structure protruding above the lower portion;
   a first dielectric layer disposed over a side surface of the fin structure and a top surface of the lower portion of the first semiconductor layer;
   a second semiconductor layer disposed over a surface of the first dielectric layer;
   a second dielectric layer disposed over a surface of the second semiconductor layer;
   a conductor layer disposed over a surface of the second semiconductor layer;
   wherein:
      the second semiconductor layer includes a source region, a channel region, and a drain region,
      the conductor layer is configured to be a first gate electrode, and
      the fin structure in the first semiconductor layer is configured to be a second gate electrode.

6. The device of claim 5, wherein
   the first semiconductor layer comprises a silicon germanium (SiGe) layer; and
   the second semiconductor layer comprises one or more of indium gallium arsenide (InGaAs), indium arsenide (InAs), indium antimonide (InSb), or germanium (Ge).

7. The device of claim 5, wherein the second semiconductor layer comprises a single crystalline material.

8. The device of claim 5, wherein the fin structure has a rectangular cross-section.

9. The device of claim 5, wherein the fin structure has a circular cross-section.

10. A semiconductor device, comprising:
    a substrate;
    a first semiconductor layer including a lower portion extending over the substrate and a fin structure protruding above the lower portion;
    a first dielectric layer surrounding the fin structure;
    a second semiconductor layer surrounding the first dielectric layer;
    a gate dielectric layer surrounding the second semiconductor layer;
    a metal layer surrounding the gate dielectric layer;
    wherein:
       the metal layer is configured to be a first gate electrode, and
       the fin structure is configured to be a second gate electrode, wherein the second semiconductor layer comprises a source region, a channel region, and a drain region.

11. The semiconductor device of claim 10, wherein the channel region has a same doping type as a doping type of the source region and the drain region.

12. The semiconductor device of claim 10, wherein the substrate comprises silicon, and the first semiconductor layer comprises silicon germanium.

13. The semiconductor device of claim 10, wherein the second semiconductor layer comprises one or more of indium gallium arsenide (InGaAs), indium arsenide (InAs), indium antimonide (InSb), or germanium (Ge).

14. The semiconductor device of claim 10, wherein the second semiconductor layer comprises a single crystalline material.

15. The semiconductor device of claim 10, wherein the fin structure has a circular cross-section.

16. The semiconductor device of claim 10, wherein the fin structure has an elliptical cross-section.

17. The semiconductor device of claim 10, wherein the fin structure has a square or rectangular cross-section.

18. The semiconductor device of claim 10, wherein the second semiconductor layer comprises a single crystalline material.

* * * * *